US009894790B2

United States Patent
Yoo et al.

(10) Patent No.: US 9,894,790 B2
(45) Date of Patent: Feb. 13, 2018

(54) ELECTRONIC COMPONENT MODULE AND MANUFACTURING METHOD THEREOF

(71) Applicant: SAMSUNG ELECTRO-MECHANICS CO., LTD., Suwon-Si, Gyeonggi-Do (KR)

(72) Inventors: Do Jae Yoo, Suwon-Si (KR); Eun Jung Jo, Suwon-Si (KR); Jae Hyun Lim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 462 days.

(21) Appl. No.: 14/260,994

(22) Filed: Apr. 24, 2014

(65) Prior Publication Data

US 2015/0131235 A1 May 14, 2015

(30) Foreign Application Priority Data

Nov. 8, 2013 (KR) .................. 10-2013-0135733

(51) Int. Cl.
*H05K 7/00* (2006.01)
*H05K 5/06* (2006.01)
(Continued)

(52) U.S. Cl.
CPC ............ *H05K 5/065* (2013.01); *H05K 1/115* (2013.01); *H01L 2224/16225* (2013.01);
(Continued)

(58) Field of Classification Search
CPC ................ H01L 21/4857; H05K 1/183–1/186
(Continued)

(56) References Cited

U.S. PATENT DOCUMENTS 7,615,707 B2 * 11/2009 Lin ..................... H05K 3/0094
174/261
8,139,368 B2 3/2012 Nomura
(Continued)

FOREIGN PATENT DOCUMENTS

CN  102593086 A  7/2012
JP    4072816 B2  4/2008
(Continued)

OTHER PUBLICATIONS

Chinese Office Action dated Jul. 19, 2017 in corresponding Chinese Patent Application No. 201410459564.1 (22 pages with English Translation).

*Primary Examiner* — Tuan T Dinh
(74) *Attorney, Agent, or Firm* — NSIP Law

(57) ABSTRACT

There are provided an electronic component module in which an external terminal is disposed outwardly from a mold part by a plating process and a manufacturing method thereof. The electronic component module includes a substrate, at least one electronic component mounted on the substrate, a mold part sealing the electronic component, and at least one connection conductor having one end bonded to one surface of the substrate and formed in the mold part so as to penetrate through the mold part. The connection conductor is formed to have a form in which horizontal cross-sectional areas of the connection conductor are gradually reduced toward the substrate and includes at least one step.

20 Claims, 6 Drawing Sheets

(51) Int. Cl.
  *H05K 1/11*  (2006.01)
  *H05K 3/00*  (2006.01)
(52) U.S. Cl.
  CPC ............... *H01L 2224/48091* (2013.01); *H01L 2924/19105* (2013.01); *H01L 2924/19106* (2013.01); *H05K 3/0047* (2013.01); *H05K 2201/09827* (2013.01); *H05K 2203/107* (2013.01)
(58) Field of Classification Search
  USPC ......... 361/760–764, 770, 790; 174/259–264; 257/785–790
  See application file for complete search history.

(56) References Cited

U.S. PATENT DOCUMENTS

| | | | |
|---|---|---|---|
| 8,217,279 B2* | 7/2012 | Matsubara | H01L 21/4857 174/254 |
| 8,508,954 B2* | 8/2013 | Kwon | H01L 21/561 361/774 |
| 2005/0128672 A1* | 6/2005 | Tourne | H05K 3/0047 361/119 |
| 2006/0094231 A1 | 5/2006 | Lane et al. | |
| 2006/0267159 A1* | 11/2006 | Yamamoto | H01L 23/3121 257/659 |
| 2012/0175781 A1 | 7/2012 | Suto | |
| 2012/0320536 A1 | 12/2012 | Yamamoto | |

FOREIGN PATENT DOCUMENTS

| | | |
|---|---|---|
| JP | 4926787 B2 | 5/2012 |
| KR | 2003-0074590 A | 9/2003 |
| WO | 02/075020 A1 | 9/2002 |

* cited by examiner

ELECTRONIC COMPONENT MODULE AND MANUFACTURING METHOD THEREOF

CROSS-REFERENCE TO RELATED APPLICATION

This application claims the benefit of Korean Patent Application No. 10-2013-0135733 filed on Nov. 8, 2013, with the Korean Intellectual Property Office, the disclosure of which is incorporated herein by reference.

BACKGROUND

The present disclosure relates to an electronic component module and a manufacturing method thereof, and in further detail, to an electronic component module in which an external terminal is disposed outwardly from a mold part by plating and a manufacturing method thereof.

The demand for portable devices has recently increased in electronic product markets. Therefore, miniaturization and lightness in electronic components mounted in the electronic devices has been continuously demanded.

In order to realize the miniaturization and lightness of electronic devices, a system on chip (SOC) technology for implementing a plurality of individual elements on one chip, a system in package (SIP) technology for integrating a plurality of individual elements in one package, or the like, as well as a technology of reducing individual sizes of mounted components is required.

Meanwhile, in order to manufacture miniaturized and high performance electronic component modules, a structure in which electronic components are mounted on both surfaces of a substrate has also been developed.

However, in the case in which electronic components are mounted on both surfaces of a substrate, there may be present difficulties in forming an external connection terminal on a substrate.

Since the electronic components are mounted on both surfaces of the substrate, a position at which the external connection terminal is to be located may not easily be secured. Therefore, an electronic component module in which an external connection terminal may be easily disposed and a method capable of easily manufacturing the electronic component module have been in demand.

RELATED ART DOCUMENT

US Patent Application Publication No. 2012-0320536

SUMMARY

Some embodiments of the present disclosure may provide an electronic component module in which an external terminal is disposed outwardly from a mold part.

Some embodiments of the present disclosure may provide a method of manufacturing an electronic component module in which an external terminal is formed outwardly from a mold part by a plating process.

According to some embodiments of the present disclosure, an electronic component module may include: a substrate; at least one electronic component mounted on the substrate; a mold part sealing the electronic component; and at least one connection conductor having one end bonded to one surface of the substrate and formed in the mold part so as to penetrate through the mold part, wherein the connection conductor is formed to have a form in which horizontal cross-sectional areas of the connection conductor are gradually reduced toward the substrate and includes at least one step.

The mold part may be formed using an epoxy molding compound (EMC).

The connection conductor may be bonded to the mold part by a plating process.

The electronic component module may further include an external connection terminal formed on the other end of the connection conductor.

According to some embodiments of the present disclosure, a manufacturing method of an electronic component module may include: preparing a substrate; mounting at least one electronic component on the substrate; forming a mold part sealing the electronic component; forming a via hole in the mold part; and forming a connection conductor in the via hole by a plating process.

The mounting of the electronic component may include mounting a plurality of electronic components on both surfaces of the substrate.

In the forming of the mold part, the mold part may be formed on both surfaces of the substrate.

In the forming of the via hole, the via hole may be formed using a laser drilling process.

The forming of the via hole may include increasing a degree of roughness of an inner surface of the via hole using the laser beam.

The forming of the via hole may include forming at least one horizontal extension surface by a step in the via hole.

The step may be formed to have a stepped form and a plurality of the horizontal extension surfaces may be disposed to be spaced from each other.

The horizontal extension surface may be continuously formed to have a spiral form.

The forming of the connection conductor may further include disposing a catalytic metal on a surface of the via hole having an increased degree of roughness.

In the forming of the connection conductor, the connection conductor may be bonded to an inner surface of the via hole by a mechanical interlocking mechanism.

In the forming of the mold part, the mold part may be formed using an epoxy molding compound (EMC) and in the forming of the connection conductor, the connection conductor may be formed through a copper plating process.

The method may further include forming an external connection terminal on the connection conductor.

In the preparing of the substrate, the substrate having an electroplating wiring formed on at least one surface of the surface may be prepared, and in the forming of the connection conductor, the connection conductor may be formed through electroplating.

According to some embodiments of the present disclosure, a manufacturing method of an electronic component module may include: preparing a substrate having at least one component sealed by a mold part; forming a via hole in the mold part and forming a horizontal extension surface to have a form in which a cross-sectional area of the via hole is horizontally increased; and forming a connection conductor in the via hole by a plating process.

In the forming of the via hole, the via hole may be formed to have an average roughness Ra of an inner surface of 5 μm or more.

In the forming of the via hole, one surface of the substrate and a side wall of the via hole may form an angle of 25° to 90°.

The forming of the connection conductor may include forming an end of the connection conductor to be convex or concave.

The method may further include forming the end of the connection conductor to be flat by grinding the end of the connection conductor.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
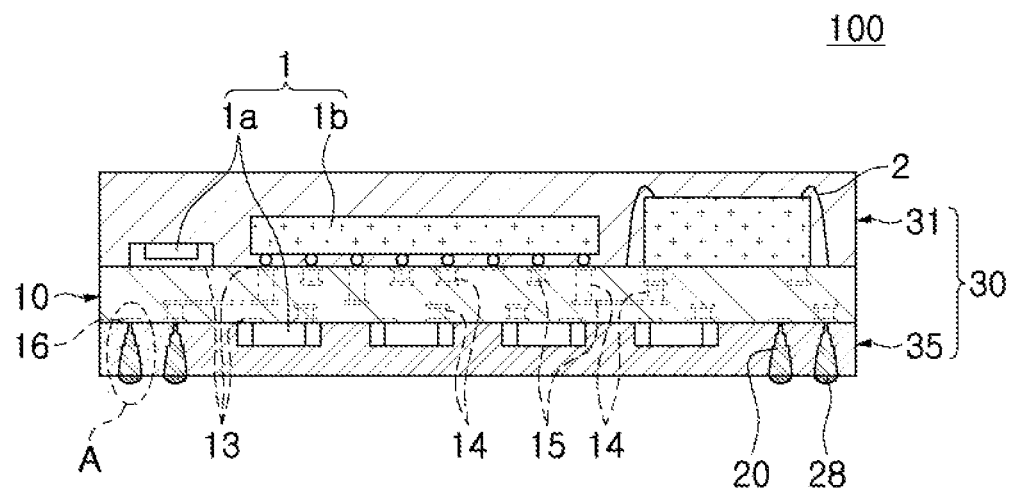
FIG. 1 is a cross-sectional view schematically illustrating an electronic component module according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
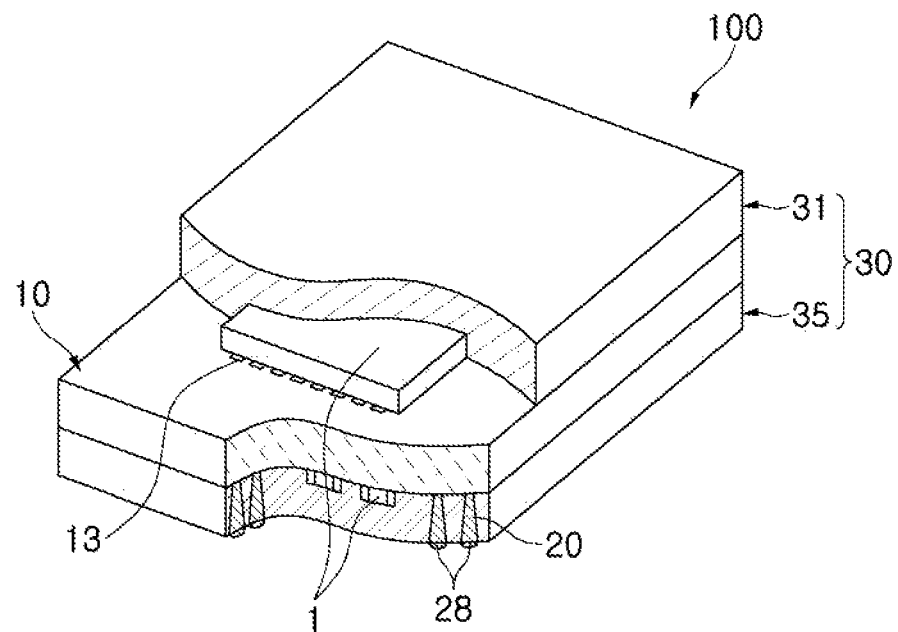
FIG. 2 is a partially cut-away perspective view illustrating an inner portion of the electronic component module shown in FIG. 1.

FIG. 1 is a cross-sectional view schematically illustrating an electronic component module according to an exemplary embodiment of the present disclosure. FIG. 2 is a partially cut-away perspective view illustrating an inner portion of the electronic component module shown in FIG. 1 and FIGS. 3A through 3C are partially enlarged cross-sectional views of part A of FIG. 1.

Referring to FIGS. 1 through 3, an electronic component module 100 according to an exemplary embodiment of the present disclosure may be configured to include an electronic component 1, a substrate 10, a connection conductor 20, and a mold part 30.

The electronic component 1 may include various components such as a passive component 1a and an active component 1b and all components which may be mounted on the substrate may be used as the electronic element 1.

The electronic component 1 may be mounted on both upper and lower surfaces of the substrate 10 described below. FIG. 1 illustrates a case in which both the active component 1b and the passive component 1a are mounted on the upper surface of the substrate 10 and only the passive component 1a is mounted on the lower surface of the substrate 10, as an example. However, the present disclosure is not limited to thereto, but the electronic components 1 may be disposed on both surfaces of the substrate 10 in various manners depending on sizes or shapes of the electronic components 1 and a design of the electronic component module 100.

The electronic components 1 may be mounted on the substrate 10 in a flip chip form or may be electrically connected to the substrate 10 through a bonding wire 2.

At least one electronic component 1 may be mounted on at least one surface of the substrate 10. As the substrate 10, various types of publicly known substrate (for example, a ceramic substrate, a printed circuit board, a flexible substrate, and the like) may be used. The substrate 10 may include mounting electrodes 13 for mounting of the electronic component 1 or wiring patterns (not shown), formed on one surface or both surfaces of the substrate, the wiring patterns electrically interconnecting the mounting electrodes 13 to one another.

The substrate 10 according to an exemplary embodiment of the present disclosure may be a multi-layer substrate including a plurality of layers, and circuit patterns 15 for electrical connection may be formed between the layers.

In addition, the substrate 10 according to an exemplary embodiment of the present disclosure may include conductive vias 14 electrically connecting the mounting electrodes 13 formed on both surfaces of the substrate 10 and the circuit patterns 15 formed in the substrate 10 to one another.

In addition, the substrate 10 may have an electroplating wiring (not shown) formed on at least one surface thereof. The electroplating wiring may be used in a process of forming the connection conductor 20 described below by electroplating.

In addition, the substrate 10 according to an exemplary embodiment of the present disclosure may include cavities (not shown) formed therein, and the cavities may allow the electronic components 1 to be embedded in the substrate 10.

In addition, the substrate 10 according to an exemplary embodiment of the present disclosure has an external connection pad 16 formed on the lower surface thereof. The external connection pad 16 may be configured to be exposed outwardly from the substrate 10. In addition, the external connection pad 16 may be configured so that a portion of the external connection pad 16 is covered with a dielectric material and only a portion thereof is exposed.

The external connection pad 16 may be provided to be electrically connected to the connection conductor 20 described below and may be connected to an external connection terminal 28 through the connecting conductor 20.

Meanwhile, the substrate 10 according to an exemplary embodiment of the present disclosure may be a substrate on which a plurality of mounting regions identical to each other are repeatedly provided in order to simultaneously manufacture a plurality of individual modules, and in further detail, may be a substrate of a quadrangular shape having a relatively wide area or a long strip form. In this case, the electronic component modules may be manufactured for respective regions in which a plurality of individual modules may be mounted.

The mold part 30 may include a first mold part 31 formed on the upper surface of the substrate 10 and a second mold part 35 formed on the lower surface of the substrate 10.

The mold part 30 may seal the electronic components 1 mounted on both surfaces of the substrate 10. In addition, the mold part 30 may fill gaps between the electronic components 1 mounted on the substrate 10 to prevent electrical short circuits between the electronic components 1 and may enclose the exteriors of the electronic components 1 and fix the electronic components 1 onto the substrate 10 to thereby safely protect the electronic components 1 from external impacts.

The mold part 30 may be formed using an insulating material containing a resin material of an epoxy such as epoxy molding compound (EMC) or the like.

The first mold part 31 according to an exemplary embodiment of the present disclosure may be formed to overall cover an entire one surface of the substrate 10. In addition, an exemplary embodiment of the present disclosure describes a case in which all of the electronic components 1 are embedded in the first mold part 31 as an example. However, the present disclosure is not limited thereto, but may be applied to various examples. For example, a portion of at least one of the electronic components 1 may be exposed outwardly from the first mold part 31.

The second mold part 35 may be formed to embed the connection conductor 20 Therein while being provided below the substrate 10.

The second mold part 35 may be formed to have a form in which all the electronic components 1 are embedded therein, similar to the first mold part 31, but may also be formed to have a form in which a portion of the electronic components 1 is exposed outwardly therefrom.

In addition, the mold part 30 according to an exemplary embodiment of the present disclosure may include at least one via hole 37 and the via hole 37 may have the connection conductor 20 disposed therein.

The connection conductor 20 may be adhered to at least one surface of the surface 10, one end thereof may be adhered to the substrate 10, and the other end thereof may be connected to the external connection terminal 28. For example, the connection conductor 20 according to an exemplary embodiment of the present disclosure may be formed in the mold part 30 so as to penetrate through the mold part 30.

The connection conductor 20 may be formed of a conductive material and may be formed of copper, gold, silver, aluminum, or an alloy thereof.

The connection conductor 20 according to an exemplary embodiment of the present disclosure may have a conical shape of which horizontal cross-sectional areas are gradually reduced toward an end thereof, for example, the substrate 10. In this case, the connection conductor 20 may have a form in which the horizontal cross-sectional areas thereof are continuously reduced toward one end thereof, and for example, may have a form in which the horizontal cross-sectional areas thereof are reduced to have a step form through the formation of a step therein according to the exemplary embodiment of the present disclosure.

Here, the step may be implemented by changing the cross-sectional areas of the connection conductor 20 in a direction in which the horizontal cross-sectional areas thereof are increased or decreased.

Figure 3A:
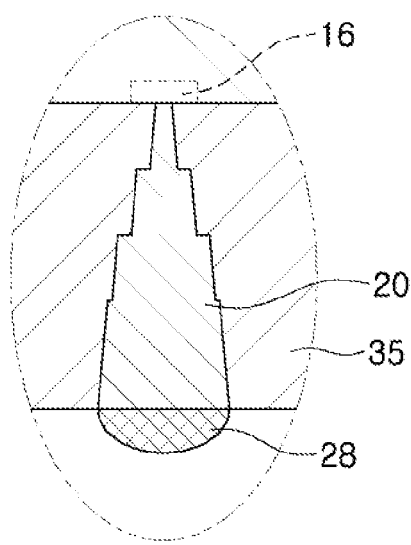
FIGS. 3A through 3C are partially enlarged cross-sectional views of part A of FIG. 1.
Figure 3B:
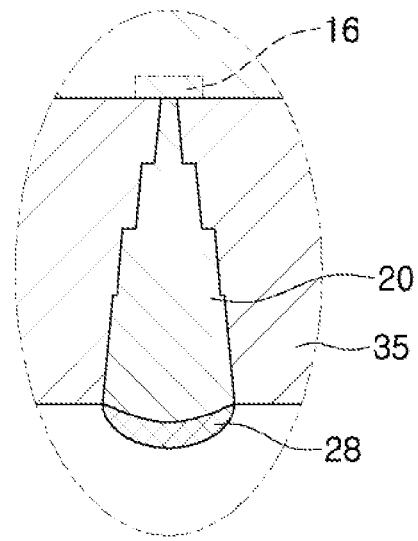
Figure 3C:
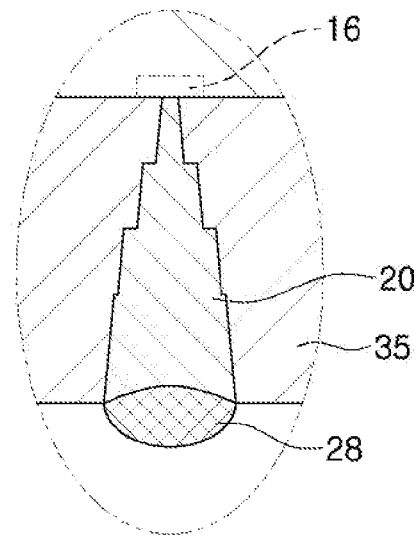

The other end of the connection conductor 20 may be formed to have a flat form as shown in FIG. 3A. However, the shape of the other end of the connection conductor 20 is not limited thereto, but the other end thereof may be formed to be concave inwardly therefrom as shown in FIG. 3B or may be formed to be convexly protruded outwardly therefrom as sown in FIG. 3C. In addition, the flat shape shown in FIG. 3A may be formed by grinding the connection conductor 20 formed to have the concave or convex shape.

The external connection terminal 28 may be bonded to the other end of the connection conductor 20. The external connection terminal 28 may electrically and physically connect the electronic component module 100 and a main substrate (not shown) on which the electronic component module 100 is mounted to each other. The external connection terminal 28 may be formed to have a bump form, but is not limited thereto. For example, the external connection terminal 28 may be formed in various forms such as a solder ball, and the like.

An exemplary embodiment of the present disclosure describes a case in which the connection conductor 20 is formed in the second mold part 35, as an example. However, the configuration of the present disclosure is not limited thereto. The connection conductor 20 may be formed in the first mold part 31, if necessary.

The electronic component module 100 according to an exemplary embodiment of the present disclosure having the configuration as described above may have the electronic components 1 mounted on both surfaces of the substrate 10. In addition, the substrate 10 and the external connection terminal 28 may be electrically connected to each other by the connection conductor 20 disposed on the lower surface of the substrate 10.

As a result, the plurality of electronic components 1 may be mounted on a single substrate, thereby increasing a degree of integration of components.

In addition, since the substrate 10 and the external connection terminal 28 are electrically connected to each other using the connection conductor 20, the external connection terminal 28 may be easily formed in a double-sided molded structure.

Next, a manufacturing method of an electronic component module according to an exemplary embodiment of the present disclosure will be described.

FIGS. 4A through 4H are cross-sectional views for describing a manufacturing method of an electronic component module shown in FIG. 1.

Figure 4A:
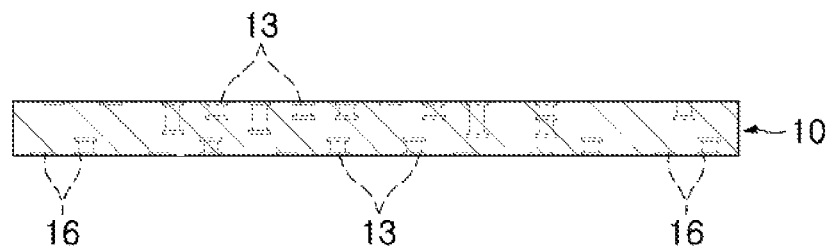
FIGS. 4A through 4H are cross-sectional views for describing a manufacturing method of an electronic component module shown in FIG. 1.

Referring to FIGS. 4A through 4H, as shown in FIG. 4A, an operation of preparing a substrate 10 is first performed. As described above, the substrate 10 may be a multi-layer substrate and may have mounting electrodes 13 formed on both surfaces thereof. In addition, an external connection pad 16 may be formed on a lower surface of the substrate 10.

Figure 4B:
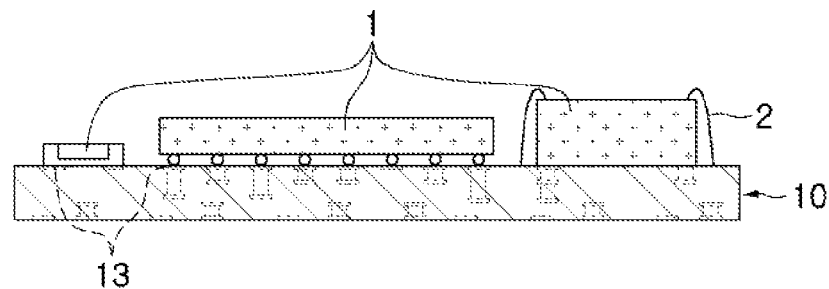

Next, as shown in FIG. 4B, an operation of mounting an electronic component 1 on one surface, for example, an upper surface of the substrate 10 is performed. The operation of mounting the electronic component 1 may be performed through processes in which a solder paste is printed on the mounting electrode 13 formed on one surface of the substrate 10 by a screen printing method, or the like, the electronic components 1 are seated on the solder paste, and the solder paste is then cured by applying heat thereto.

However, the operation of mounting the electronic component 1 is not limited thereto, but may be performed through processes in which the electronic component 1 is seated on one surface of the substrate 10, and the mounting electrodes 13 formed on the substrate and an electrode of the electronic component 1 are then electrically connected to each other by a bonding wire 2.

Figure 4C:
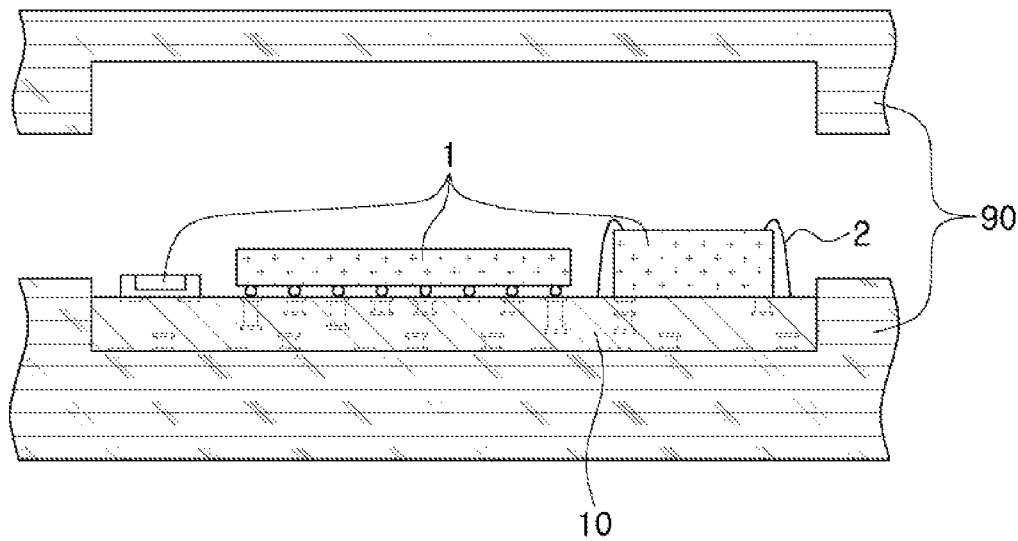

Next, an operation of forming a first mold part 31 on one surface of the substrate 10 is performed. In the operation of forming the first mold part 31, as shown in FIG. 4C, an operation of disposing the substrate 10 having the electronic component 1 formed thereon in a mold 90 is first performed.

Figure 4D:
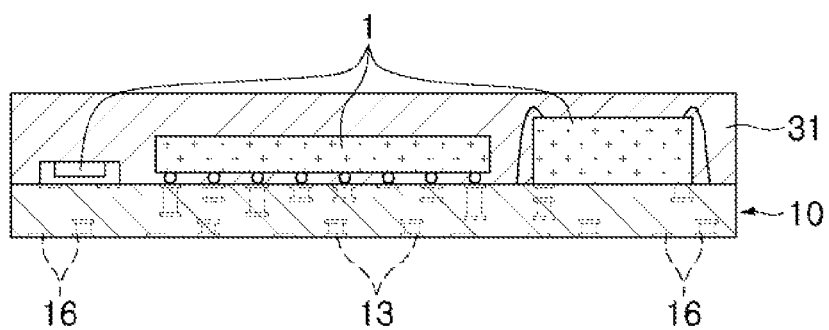

Next, the first mold part 31 is formed by injecting a molding resin into the mold 90. As a result, as shown in FIG. 4D, the electronic components 1 mounted on one surface, for example, an upper surface of the substrate 10 may be protected externally by the first mold part 31.

Figure 4E:
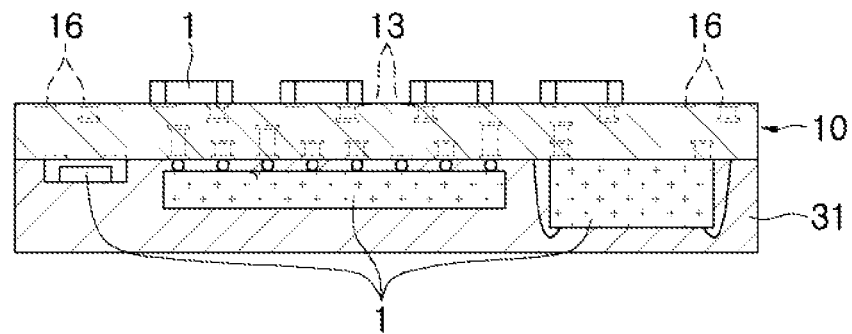

Subsequently, as shown in FIG. 4E, an operation of mounting the electronic components 1 on a lower surface of the substrate 10 is performed. The operation of mounting the electronic components 1 may be performed through processes in which a solder paste is printed on the mounting electrode 13 by a screen printing method, or the like, the electronic components 1 are seated on the solder paste, and the solder paste is then cured by applying heat thereto.

Figure 4F:
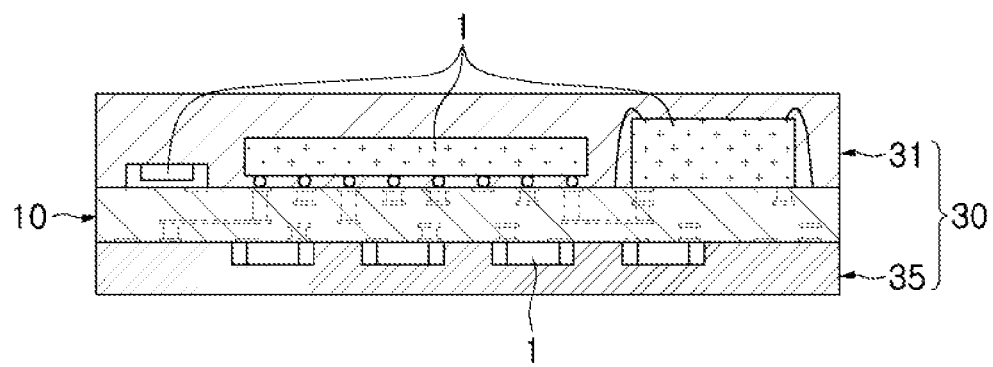

Next, as shown in FIG. 4F, an operation of forming a second mold part 35 on the lower surface of the substrate 10 is performed. The operation of forming the second mold part 35 may be performed by disposing the substrate 10 in the mold 90 and then injecting the molding resin into the mold 90, similar to the case shown in FIG. 4C.

Figure 4G:
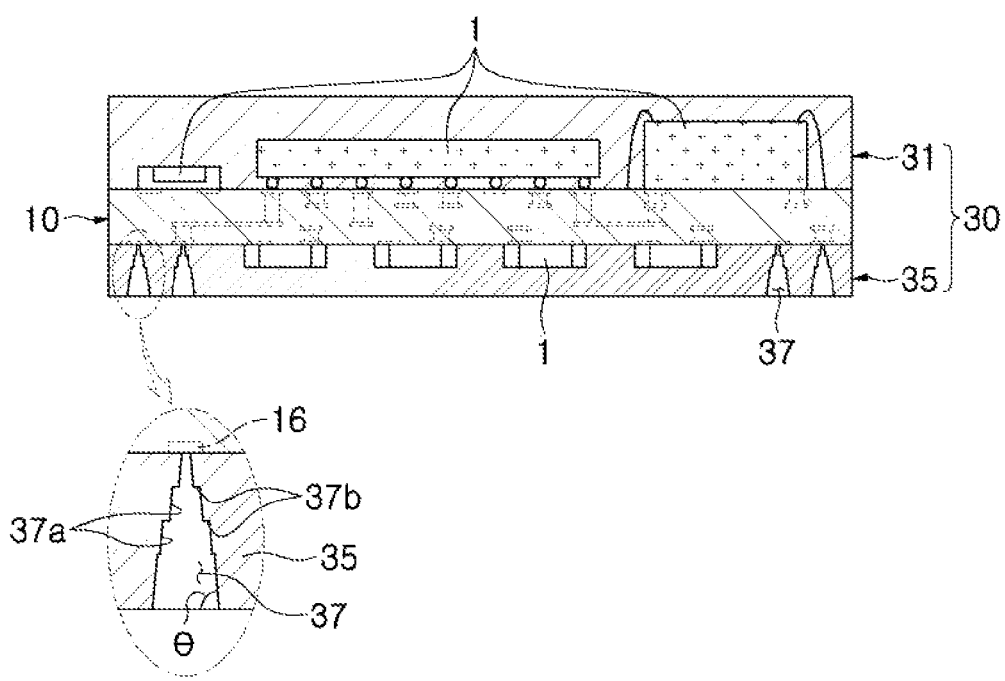

Next, as shown in FIG. 4G, the via hole 37 is formed to have the second mold part 35. The via hole 37 may be formed using a laser drilling process.

In the process of forming the via hole 37, the via hole 37 may be formed to have a conical shape of which horizontal cross-sectional areas are gradually reduced toward the substrate 10. In addition, the via hole 37 may be formed to have a form in which the horizontal cross-sectional areas thereof are gradually reduced through steps formed thereon.

Therefore, the via hole 37 according to the exemplary embodiment of the present disclosure may include side walls 37a, an inner side wall, formed in an approximately vertical direction and at least one surface 37b extended horizontally into the via hole, inwardly from the side wall 37a in a direction perpendicular to the side wall.

The via hole 37 according to the exemplary embodiment of the present disclosure may be implemented by irradiating a laser beam having a spot size smaller than a diameter of one end of the via hole 37, to the mold part 30.

For example, the laser beam is first irradiated into the center of the via hole 37, and positions of the via hole into which the laser beam is irradiated are then changed during the irradiation of laser beam so as to form the via hole 37 according to the exemplary embodiment of the present disclosure.

The structure of the via hole 37 described above is a configuration for securing bonding strength by mechanical anchoring between the connection conductor 20 and the via hole 37 in a process of forming the connection conductor 20 described below.

The mold part 30 according to an exemplary embodiment of the present disclosure may be formed using an EMC. It is generally known that there may be present difficulties in performing a plating process, for example, metal bonding, on a surface of the EMC, a thermosetting resin.

Therefore, the method of manufacturing an electronic component module according to an exemplary embodiment of the present disclosure may use a mechanical interlocking principle, a hooking concept, an anchoring theory or an anchoring effect in order to plate the surface of EMC with a conductor. This indicates a mechanism in which an adhesive penetrates an irregular structure (a concave-convex structure) of an adhered object surface to thereby provide mechanical interlocking.

For example, the manufacturing method according to the exemplary embodiment of the present disclosure may use a method in which an inner surface of the via hole 37 formed of the EMC is formed to be significantly rough and a plating material is bonded to the inner surface of the via hole 37 by the anchoring effect in the plating process.

To this end, according to an exemplary embodiment of the present disclosure, an irregular structure is formed by significantly increasing an inner surface roughness of the via hole 37 during a process of forming the via hole 37 using the laser beam. Here, the surface roughness may be increased by adjusting a kind or spot size of the laser beam and laser beam power.

Meanwhile, since the side wall 37a of the via hole 37 is vertically formed or is formed to have a relatively large inclination angle, there may be present a limitation in increasing the roughness only using the laser beam. Therefore, in the case of the manufacturing method of the electronic component module according an exemplary embodiment of the present disclosure, a step may be formed on the via hole 37 such that the horizontal extension surface 37b, a surface approximately perpendicular to a direction in which the laser beam is irradiated may be formed.

The horizontal extension surface 37b may be formed as a surface of an element disposed to be perpendicular to the direction in which the laser beam is irradiated, but is not limited thereto. For example, the horizontal extension surface 37b may also be formed as an inclined surface. For example, the horizontal extension surface 37b according to an exemplary embodiment of the present disclosure may be defined as a surface formed to be subsequently perpendicular to the direction in which the laser beam is irradiated, as compared to the side wall 37a.

Since a relatively large amount of a laser beam spot may be irradiated onto the horizontal extension surface 37b, the wall surface of the via hole 37 may be formed to have a higher degree of roughness.

When measuring an average roughness Ra of the horizontal extension surface 37b and the side wall 37a formed by the laser beam (e.g., UV laser beam), in the case in which the average roughness of the side wall 37a was 5.49 µm, the average roughness of the horizontal extension surface 37b was 12.51 µm.

For example, in the case of using the laser beam, the roughness of the horizontal extension surface 37b and the side wall 37a has a large difference. As a result, it may be appreciated that the horizontal extension surface 37b is a very important factor in performing the plating process.

When the average roughness Ra is approximately 5 µm or more, the plating process may be performed. However, since the mechanical anchoring force is not enough, it may be difficult to firmly bond a plated layer to the inner surface of the via hole 37 in the case in which the horizontal extension surface 37b is not present.

Therefore, the via hole 37 according to the exemplary embodiment of the present disclosure may include the horizontal extension surface 37b formed to have the average roughness of 12 µm or more. In the case in which the average roughness Ra is 12 µm or more, since the firm bonding and plating at an interface between heterogeneous surfaces may be performed, plating reliability and bonding strength in the via hole 37 may be increased.

The via hole 37 according to an exemplary embodiment of the present disclosure may be formed to have the average roughness Ra of 5 µm or more and may include at least one horizontal extension surface 37b formed to have the average roughness of 12 µm or more.

In addition, an inclination angle (θ) of the side wall 37a (the inner side wall) of the via hole 37, based on a horizontal surface (or one surface of the substrate), as shown in FIG. 4g, may be 25° to 90°. In the case in which the inclination angle (θ) is less than 25°, it may be difficult to perform the drilling process using the laser beam and in the case in which the inclination angle (θ) exceeds 90°, it may be difficult to form the horizontal extension surface 37b.

Meanwhile, in the case in which it is difficult to obtain an optimal roughness only using the laser beam, an etching process may be additionally performed. For example, the roughness may be further increased by injecting an etchant into the via hole 37 and removing it after a predetermined time.

Figure 4H:
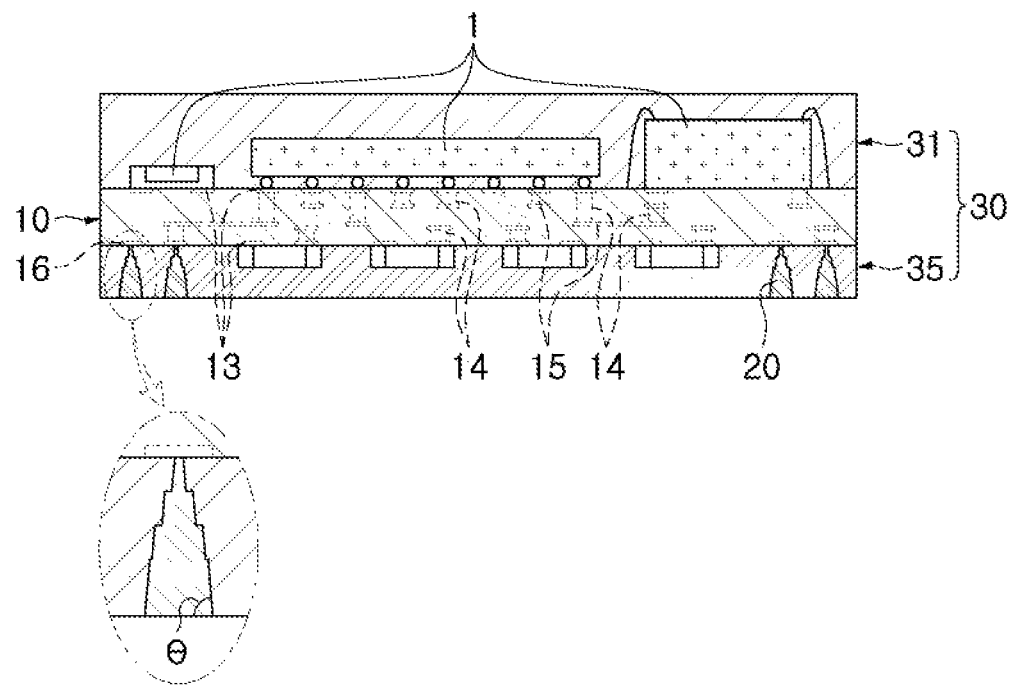

Next, as shown in FIG. 4H, the connection conductor 20 is formed in the via hole 37. The connection conductor 20 may be formed through the plating process. When the connection conductor 20 is formed of a copper (Cu) material, a copper plating process may be performed. In addition, the plating process may include an electroless plating process and an electroplating process, but is not limited thereto.

For example, the connection conductor 20 may also be formed using only the electroplating process. In this case, the connection conductor 20 may be formed while sequentially filling the via hole 37 from the external electrode terminal 16 of the substrate 10 using an electroplating wiring (not shown) formed on the substrate 10.

As described above, since the connection conductor 20 according to an exemplary embodiment of the present disclosure is formed on an EMC surface, it may be difficult to perform the metal bonding. However, since the manufacturing method according to an exemplary embodiment of the present disclosure may form a significantly high degree of roughness of the inner surface of the via hole 37 during the process of forming the via hole 37, even in a case in which the mold part is formed of the EMC material, the bonding strength at an interface between heterogeneous surfaces of the connection conductor 20 and the via hole 37 may be easily performed.

In addition, the manufacturing method according to an exemplary embodiment of the present disclosure may perform the plating only in a necessary portion (e.g., the inner surface of the via hole) in the plating process. A detailed description thereof will be provided below.

As describe above, since the metal is not easily bonded to the surface of the EMC, even in a case in which a plating solution is applied onto the entire surface of the mold part during the plating process, the plating layer is not easily formed and the plating is performed at only the portions having the roughness of a threshold or more, for example, an inner portion of the via hole 37.

Therefore, since the plating layer is not formed on an unnecessary portion, a process of removing the plating layer formed on the unnecessary portion is not required and the usage of the plating solution may be significantly decreased, such that manufacturing costs may be decreased.

Meanwhile, in this process, in order to increase bonding strength between the connection conductor 20 and the mold part 30, a catalytic metal such as gold, platinum, palladium, or the like is first disposed on the inner surface of the via hole 37 and copper plating may then be performed.

In the case in which the connection conductor 20 is formed in the via hole 37 according to the operations described above, an external connection terminal 28 is formed at the other end of the connection conductor 20, such that the electronic component module 100 according to the exemplary embodiment of the present disclosure shown in FIG. 1 may be completed.

Here, the external connection terminal 28 may be formed in various forms such as a bump, a solder ball, and the like, and may be omitted, if necessary.

The electronic component module 100 according to an exemplary embodiment of the present disclosure manufactured through the operations described above may have the electronic components 1 mounted on both surfaces of the substrate 10, and all the electronic components 1 may be sealed by the mold part 30. Therefore, the plurality of components may be mounted in one electronic component module 100 and may be easily protected externally.

In addition, the connection conductor 20 may be formed in the via hole 37 formed in the mold part by the plating process. Therefore, the conductor path for external connection of the substrate 10 may be relatively easily implemented and manufactured in the double-sided molded structure.

In addition, since the connection conductor 20 may be formed only in the necessary portion by the plating process, manufacturing costs and time may be significantly decreased.

In addition, since the plating process is used, the connection conductor 20 may be easily formed in the via hole 37 as compared to a process using conductive paste according to related art even when the via hole has a micro-size.

Meanwhile, although an exemplary embodiment of the present disclosure describes a case in which the first mold part 31 is first formed and the second mold part 35 is then formed, as an example, the configuration of the present disclosure is not limited thereto. Various applications may be made. For example, the second mold part 35 may be first made. In addition, after all the electronic components 1 are mounted on both surfaces of the substrate 10, the first and second mold parts 31 and 35 may be formed simultaneously with each other.

Figure 5:
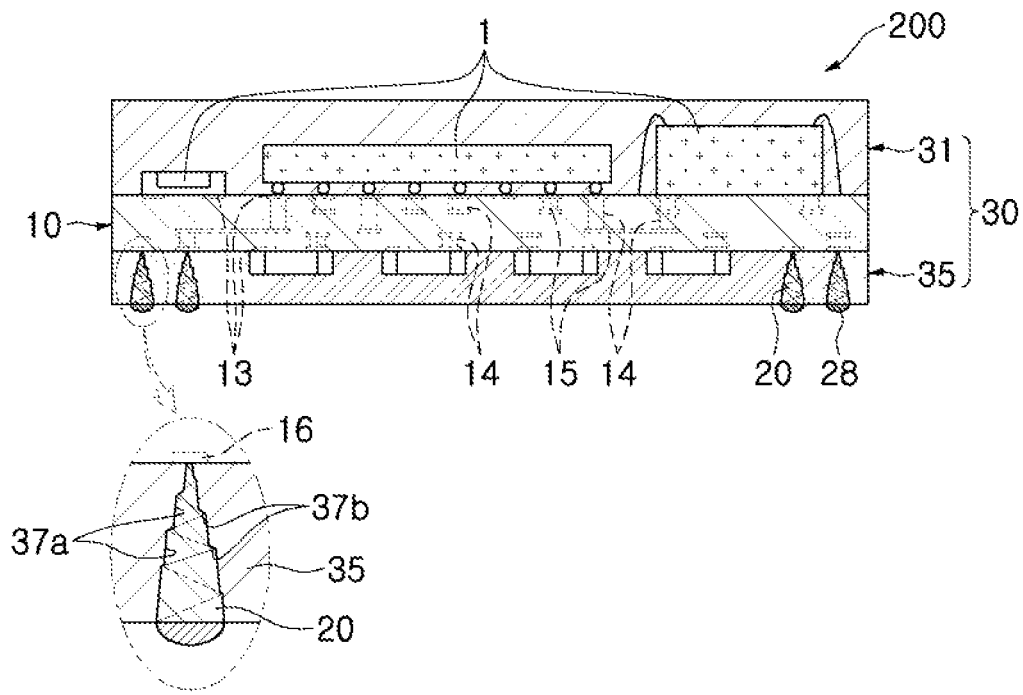
FIG. 5 is a cross-sectional view schematically illustrating an electronic component module according to another exemplary embodiment of the present disclosure.

FIG. 5 is a cross-sectional view schematically illustrating an electronic component module according to another exemplary embodiment of the present disclosure.

Referring to FIG. 5, an electronic component module 200 according to another exemplary embodiment of the present disclosure may include a connection conductor 20 formed to have a spiral form, for example, the form of screw.

As such, in the case in which the connection conductor 20 is formed to have the spiral form, a horizontal extension surface 37b may be formed as a continuous surface.

Figure 6:
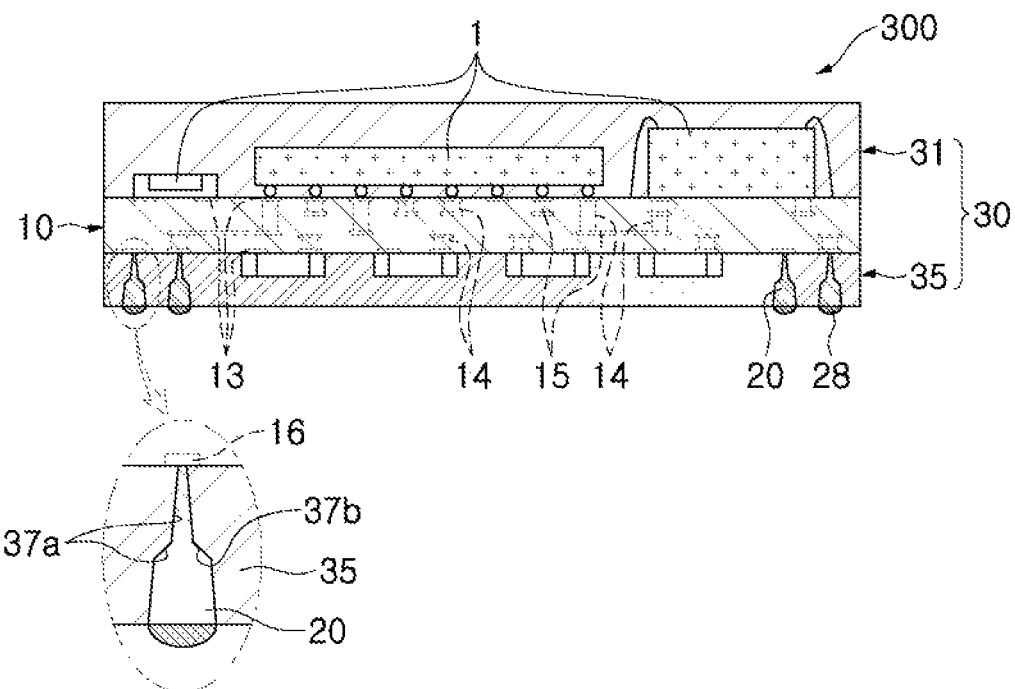
FIG. 6 is a cross-sectional view schematically illustrating an electronic component module according to another exemplary embodiment of the present disclosure.

FIG. 6 is a cross-sectional view schematically illustrating an electronic component module according to another exemplary embodiment of the present disclosure.

Referring to FIG. 6, an electronic component module 300 according to another exemplary embodiment of the present disclosure may include a connection conduction 20 or a via hole 37 having only a single step.

A horizontal extension surface 37b of the via hole 37 corresponding to the step of the connection conductor 20 may be formed as an inclined surface rather than a perfectly horizontal surface. However, the horizontal extension surface 37b may also be formed of the perfectly horizontal surface.

In addition, side walls 37a of the via hole 37 according to another exemplary embodiment of the present disclosure may be formed to have different inclinations, based on the horizontal extension surface 37b. An angle of inclination may be changed depending on a size or depth of the via hole 37.

Figure 7:
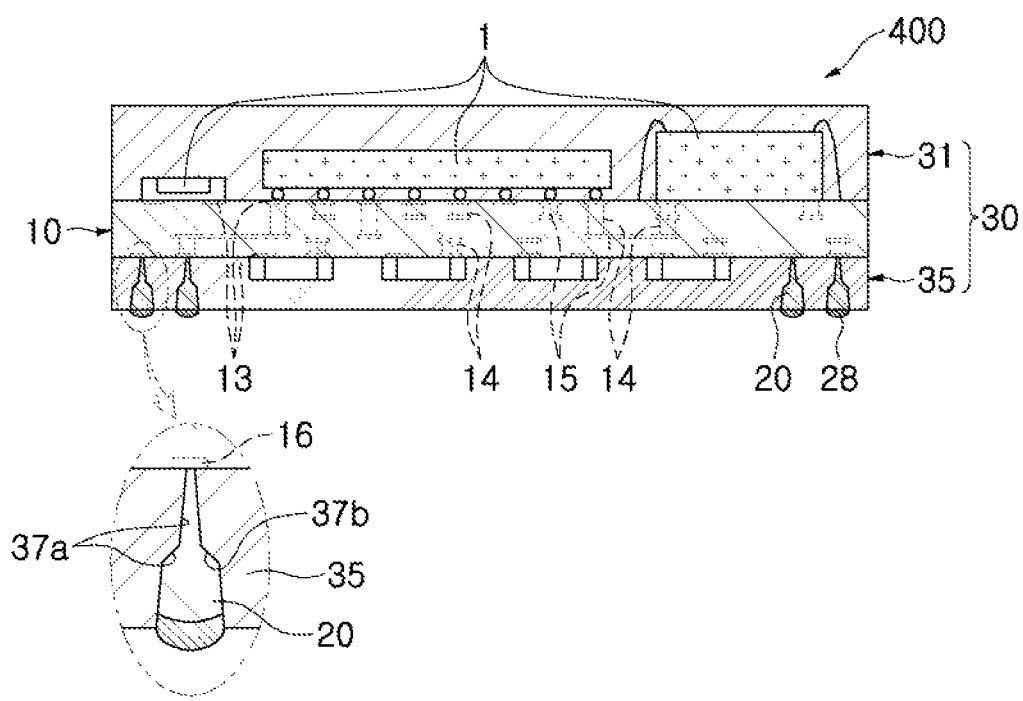
FIG. 7 is a cross-sectional view schematically illustrating an electronic component module according to another exemplary embodiment of the present disclosure.

FIG. 7 is a cross-sectional view schematically illustrating an electronic component module according to another exemplary embodiment of the present disclosure.

Referring to FIG. 7, an electronic component module 400 according to another exemplary embodiment of the present disclosure may include a connection conductor 20 or a via hole 37 having only a single step, and an end of the connection conductor 20 may have a form in which it is convex outwardly from an inner portion of the via hole 37 (i.e., at a lower portion thereof). However, the shape of the connection conductor 20 is not limited thereto, but the connection conductor 20 may be concavely or convexly formed at an end thereof as described above.

In addition, an external connection terminal 28 according to another exemplary embodiment of the present disclosure may be formed using a conductive paste.

Therefore, the connection conductor 20 according to another exemplary embodiment of the present disclosure may be formed in the via hole 37 by the plating process and the external connection terminal 28 may be formed by applying, melting and then curing the conductive paste.

As such, the electronic component module according to exemplary embodiments of the present disclosure may be formed in various shapes as long as the connection conductor may be easily bonded to the inner surface of the via hole by the plating.

According to exemplary embodiments of the present disclosure, the electronic component module may have the electronic components mounted on both surfaces of the substrate and all the electronic components may be sealed by the mold part. Therefore, the plurality of components may be mounted in one electronic component module and may be easily protected externally.

The connection conductor may be formed in the via hole formed in the mold part by the plating process. Therefore, the conductor path for external connection of the substrate may be relatively easily implemented and manufactured even in the double-sided molded structure.

In addition, since the connection conductor may be selectively formed only in the necessary portion by the plating process, manufacturing costs and time may be significantly decreased.

In addition, since the plating process is used, the connection conductor may be easily formed in the via hole as compared to a process using conductive paste according to related art even in a case in which the via hole has a micro-size.

In addition, since the via hole is bonded to the connection conductor by the mechanical anchoring due to the roughness of the surface processed by the laser beam, even in the case in which the delamination at an interface occurs, crack propagation followed by the delamination may be prevented.

While exemplary embodiments have been shown and described above, it will be apparent to those skilled in the art that modifications and variations could be made without departing from the spirit and scope of the present disclosure as defined by the appended claims.

What is claimed is:

1. An electronic component module, comprising:
a substrate;
at least one electronic component mounted on the substrate;
a mold part sealing the at least one electronic component and having via holes penetrating through the mold part; and
connection conductors respectively embedded in the via holes, and having one end bonded to a surface of the substrate,
wherein each of the connection conductors comprises at least two steps, and horizontal cross-sectional areas that gradually become smaller in a direction of the substrate,
wherein each of the via holes comprise a side wall and a horizontal extension surface horizontally increasing a cross-sectional area of the via holes, and
a degree of roughness of the horizontal extension surface is greater than a degree of roughness of the side wall.

2. The electronic component module of claim 1, wherein the mold part is formed using an epoxy molding compound (EMC).

3. The electronic component module of claim 1, wherein the connection conductor is bonded to the mold part by a plating process.

4. The electronic component module of claim 1, further comprising an external connection terminal formed on the other end of the connection conductor.

5. A manufacturing method of an electronic component module, the method comprising:
preparing a substrate;
mounting at least one electronic component on the substrate;
forming a mold part sealing the electronic component;
forming via holes in the mold part; and
forming connection conductors in the via holes, respectively, by a plating process,
wherein each of the connection conductors comprises at least two steps and horizontal cross-section areas that gradually become smaller in a direction of the substrate,
wherein each of the via holes comprise a side wall and a horizontal extension surface horizontally increasing a cross-section area of the via holes, and
a degree of roughness of the horizontal extension surface is greater than a degree of roughness of the side wall.

6. The method of claim 5, wherein in the mounting of the electronic component, a plurality of electronic components are mounted on both surfaces of the substrate.

7. The method of claim 5, wherein in the forming of the mold part, the mold part is formed on both surfaces of the substrate.

8. The method of claim 5, wherein in the forming of the via holes, a laser drilling process is used.

9. The method of claim 5, wherein in the forming of the mold part, the mold part is formed using an epoxy molding compound (EMC) and in the forming of the connection conductors, the connection conductors are formed through a copper plating process.

10. The method of claim 5, further comprising forming an external connection terminal on the connection conductor.

11. The method of claim 5, wherein in the preparing of the substrate, the substrate having an electroplating wiring formed on at least one surface of the surface is prepared, and in the forming of the connection conductors, the connection conductors are formed through electroplating.

12. The method of claim 8, wherein the degree of roughness of the horizontal extension surfaces is formed using the laser beam.

13. The method of claim 12, wherein the horizontal extension surface is continuously formed to have a spiral form.

14. The method of claim 12, wherein the forming of the connection conductors further comprise disposing a catalytic metal on surfaces of the via holes.

15. The method of claim 12, wherein in the forming of the connection conductors, the connection conductors are bonded to an inner surface of the via holes by a mechanical interlocking mechanism.

16. A manufacturing method of an electronic component module, comprising:

preparing a substrate having at least one component sealed by a mold part;

forming via holes in the mold part and forming a horizontal extension surface to have a form in which a cross-sectional area of each of via holes is horizontally increased; and forming connection conductors in the via holes by a plating process, respectively, wherein each of the connection conductors comprises at least two steps, and horizontal cross-sectional areas that gradually become smaller in a direction of the substrate, wherein each of the via holes comprise a side wall and a horizontal extension surface, and a degree of roughness of the horizontal extension surface is greater than a degree of roughness of the side wall.

17. The method of claim 16, wherein in the forming of the via holes, the via holes are formed to have an average roughness Ra 5 μm or more.

18. The method of claim 16, wherein in the forming of the via holes, one surface of the substrate and the side wall of the via holes form an angle of 25° to 90°.

19. The method of claim 16, wherein the forming of the connection conductors comprise forming an end of the connection conductor to be convex or concave.

20. The method of claim 19, further comprising forming the end of the connection conductors to be flat by grinding the end of the connection conductor.

\* \* \* \* \*